(12) United States Patent
Suzuki

(10) Patent No.: US 9,543,020 B2
(45) Date of Patent: Jan. 10, 2017

(54) NONVOLATILE SEMICONDUCTOR MEMORY DEVICE

(71) Applicant: Kabushiki Kaisha Toshiba, Tokyo (JP)

(72) Inventor: Yuya Suzuki, Fukushima (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 753 days.

(21) Appl. No.: 13/787,730

(22) Filed: Mar. 6, 2013

(65) Prior Publication Data

US 2013/0265829 A1    Oct. 10, 2013

(51) Int. Cl.
*G11C 16/10* (2006.01)
*G11C 16/34* (2006.01)
*G11C 16/04* (2006.01)

(52) U.S. Cl.
CPC ........... *G11C 16/10* (2013.01); *G11C 16/3459* (2013.01); *G11C 16/0483* (2013.01)

(58) Field of Classification Search
CPC .. G11C 16/10; G11C 16/0483; G11C 16/3456
USPC .......... 702/185; 365/185.21, 185.22, 185.03, 365/185.18, 185.13, 185.09, 185.17
See application file for complete search history.

(56) References Cited

U.S. PATENT DOCUMENTS

| | | | |
|---|---|---|---|
| 5,333,122 A | | 7/1994 | Ninomiya |
| 5,487,036 A | * | 1/1996 | Akaogi et al. ............ 365/189.09 |
| 5,490,107 A | * | 2/1996 | Akaogi et al. ............ 365/185.22 |
| 5,590,074 A | * | 12/1996 | Akaogi et al. ............ 365/185.22 |
| 7,305,596 B2 | * | 12/2007 | Noda et al. .................... 714/718 |
| 7,616,487 B2 | * | 11/2009 | Cho .......................... 365/185.13 |
| 8,385,126 B2 | * | 2/2013 | Shiino et al. ............. 365/185.18 |
| 8,625,355 B2 | * | 1/2014 | Chokan et al. .......... 365/185.22 |
| 8,649,221 B2 | * | 2/2014 | Shiino et al. ............. 365/185.18 |
| 8,773,916 B2 | * | 7/2014 | Kim ......................... 365/185.22 |
| 9,025,387 B2 | * | 5/2015 | Shiino et al. ............. 365/185.18 |
| 2006/0018162 A1 | | 1/2006 | Kawai |
| 2006/0026489 A1 | * | 2/2006 | Noda et al. .................... 714/768 |
| 2008/0106941 A1 | * | 5/2008 | Cho .......................... 365/185.13 |
| 2010/0124111 A1 | | 5/2010 | Suzuki et al. |

(Continued)

FOREIGN PATENT DOCUMENTS

| | | |
|---|---|---|
| JP | H07-169285 | 7/1995 |
| JP | 2003-077283 | 3/2003 |

(Continued)

OTHER PUBLICATIONS

Office Action dated Aug. 5, 2014 in counterpart Japanese Patent Application 2012-070159.

*Primary Examiner* — Carol S Tsai
(74) *Attorney, Agent, or Firm* — Patterson & Sheridan, LLP

(57) ABSTRACT

A nonvolatile semiconductor memory device includes an array of memory cells arranged at the position intersecting positions of the word line and the bit line, a control signal generating circuit for carrying out a writing operation including a program for carrying out writing in the memory cell and a verification for verifying whether the data has been correctly written in the memory cell by the program, and a cell source monitoring circuit for detecting a voltage of the source line connected to the memory cell during the writing operation. The control signal generating circuit directly shifts the source line voltage at the time of program to a lower voltage necessary at the time of verification after the end of the program, based on the voltage the source line detected by the cell source monitoring circuit.

19 Claims, 5 Drawing Sheets

(56) References Cited

U.S. PATENT DOCUMENTS

| | | | |
|---|---|---|---|
| 2010/0224351 A1 | 9/2010 | Sasaoka et al. | |
| 2011/0292724 A1* | 12/2011 | Kim | 365/185.03 |
| 2012/0155186 A1* | 6/2012 | Chokan et al. | 365/185.22 |
| 2012/0243324 A1* | 9/2012 | Nawata | G11C 11/5628 |
| | | | 365/185.19 |
| 2012/0257453 A1* | 10/2012 | Shiino et al. | 365/185.18 |
| 2013/0135939 A1* | 5/2013 | Shiino et al. | 365/185.21 |
| 2013/0279264 A1* | 10/2013 | Kim | 365/185.22 |
| 2014/0085988 A1* | 3/2014 | Shiino et al. | 365/185.18 |
| 2014/0313823 A1* | 10/2014 | Kim | 365/185.03 |
| 2015/0213903 A1* | 7/2015 | Shiino et al. | |

FOREIGN PATENT DOCUMENTS

| | | |
|---|---|---|
| JP | 2008-251096 | 10/2008 |
| JP | 2009-087432 | 4/2009 |
| JP | 2010-123201 | 6/2010 |
| JP | 2011-044187 | 3/2011 |

\* cited by examiner

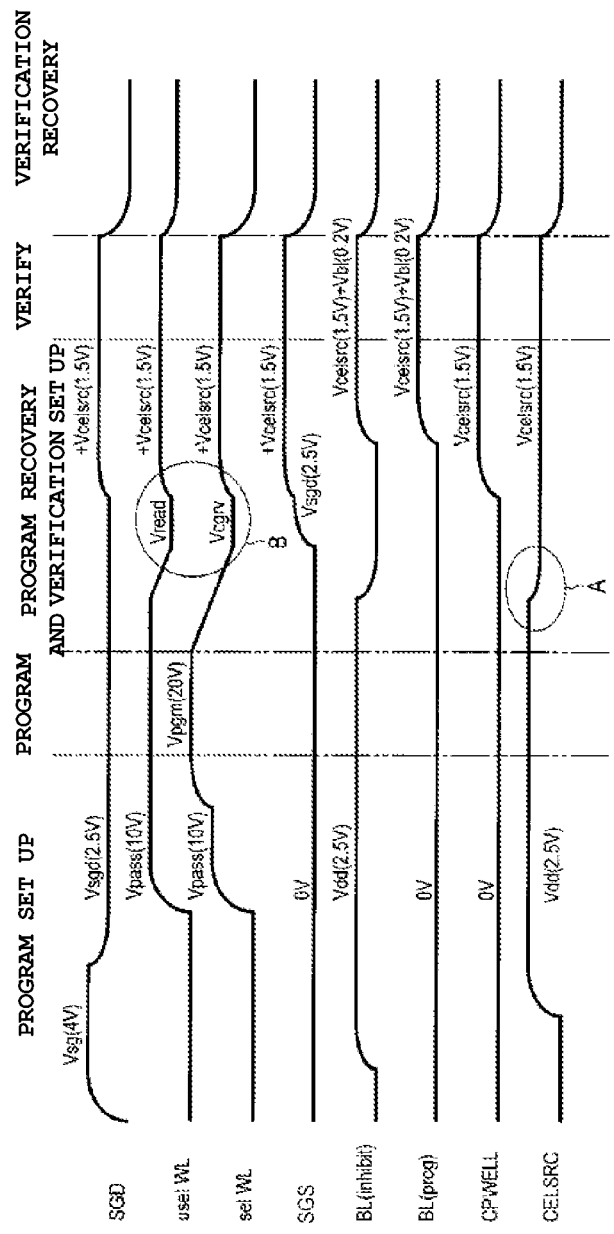

NONVOLATILE SEMICONDUCTOR
MEMORY DEVICE

CROSS-REFERENCE TO RELATED APPLICATION

This application is based upon and claims the benefit of priority from Japanese Patent Application No. 2012-070159, filed Mar. 26, 2012; the entire contents of which are incorporated herein by reference.

FIELD

Embodiments described herein relate to a nonvolatile semiconductor memory device.

BACKGROUND

The NAND-type flash memory is one type of nonvolatile semiconductor memory device. The write operation in the NAND-type flash memory is carried out as follows.

After loading the data from external sources, the program that writes the data in the memory cell and verification for verifying whether the data is correctly written or not, are carried out. Then, verification and program are repeatedly carried out until there is a confirmation that the data is correctly written in the memory cell by verification.

If upon verification, it is confirmed that the data is not correctly written, the write voltage Vpgm will be slightly increased, and the verification will be carried out again. In this manner, the write operation is carried out.

DESCRIPTION OF THE DRAWINGS

FIG. 6 is the timing chart of the write operation in the NAND-type flash memory of the second embodiment.

DETAILED DESCRIPTION

Figure 1:
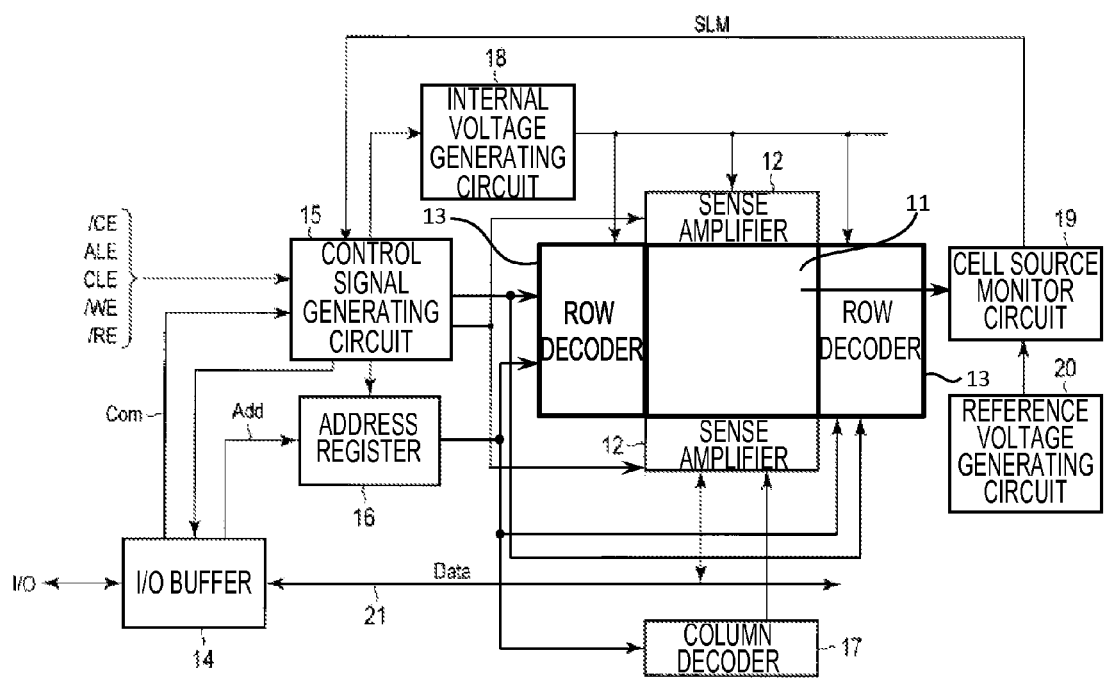
FIG. 1 is a block diagram illustrating the configuration of a NAND-type flash memory of a first embodiment.

Embodiments provide a nonvolatile semiconductor memory device that can carry out a high speed writing operation.

In general, embodiments of the nonvolatile semiconductor memory device will be explained with reference to the drawings below. Here, the NAND-type flash memory is provided as an example of the nonvolatile semiconductor memory device. Then, in the explanation below, the constituent elements having the same function and configuration will be given the same reference numerals and repetitive explanation will be provided only when necessary.

The nonvolatile semiconductor memory device according to a first embodiment includes a memory cell array having several memory cells arranged at intersections of word lines and bit lines, a control circuit for carrying out writing operation including a writing program for writing data in the memory cell and a verification for verifying whether the data has been correctly written in the memory cell or not by the writing program, and a source line monitor circuit for detecting a voltage of the source line connected to the memory cell during the writing operation, wherein the control circuit directly shifts the voltage of the source line from a first voltage equal to a voltage of the source line during the program to a second voltage equal to a voltage required at the time of verification after the end of the program.

First Embodiment

The NAND-type flash memory of the first embodiment will be explained.

FIG. 1 is a block diagram that shows the configuration of the NAND-type flash memory of the first embodiment.

As shown in the drawing, the NAND-type flash memory (hereinafter will be described as the flash memory) is equipped with a memory cell array 11, sense amplifier 12, row decoder 13, an input/output (I/O) buffer 14, a control signal generating circuit 15, an address register 16, a column decoder 17, an internal voltage generating circuit 18, a cell source monitor circuit 19, and reference voltage generating circuit 20.

Figure 2:
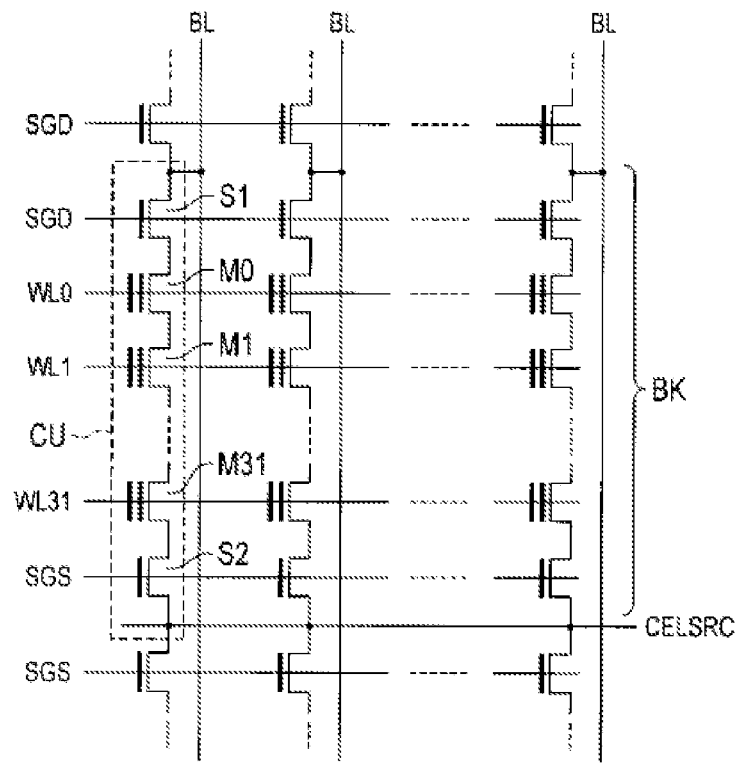
FIG. 2 is a circuit schematic of a memory cell array in the NAND-type flash memory of the first embodiment.

FIG. 2 is the equivalent circuit schematic of the memory cell array 11 in the flash memory.

The memory array 11 is configured from several NAND cell units CU that are arranged in a matrix form as shown in FIG. 2. The NAND cell unit CU contains memory cells M0, M1, M2, . . . , M31 that are connected in series and select gate transistors S1 and S2 connected at both sides so as to sandwich several memory cells.

Thirty-two memory cells, M0 to M31, are connected in series. Each memory cell has a stacked gate structure in which a gate insulating film, a floating gate electrode, an inter-gate insulating film, and a control gate electrode are laminated on a p-type well formed in the semiconductor substrate. Each memory cell includes an electrically rewritable non-volatile memory cell transistor.

One end of the NAND cell unit CU is connected to bit line BL via the select gate transistor S1, while the other end is connected to a common source line CELSRC via the select gate transistor S2.

The control gate of memory cells M0, M1, M2, . . . , M31 inside NAND cell unit Cu are connected to the word lines WL0, WL1, WL2, . . . , WL31, respectively. And the gates of the select gate transistors S1 and S2 are connected to the select gate lines SGD and SGS, respectively.

The collection of NAND cell units CU shared by one word line constitutes a block BK that will become the erase unit of the data. Several blocks BK are arranged in the bit line direction. The memory cell commonly connected to one word line WL constitutes one page. The source line CELSRC is connected to the cell source monitor circuit 19, which will be described later. Furthermore, each bit line BL is connected to the sense amplifier 12, which will also be described later.

The sense amplifier 12 is arranged in the bit line direction of the memory cell array 11 as shown in FIG. 1. The sense amplifier 12 combines a data latch for retaining the write data of one page, along with the read data of the page unit. That is, the reading and writing are done on a page-by-page basis.

Then, the sense amplifier 12 is of current detection type that can read the data of several memory cells selected via all of the bit lines BL inside the block BK, for example. The sense amplifier 12 comes with a data cache for temporarily storing the input and output data and a column select gate circuit for carrying out column selection.

The row decoder 13 is arranged in the direction of the word line of the memory cell array 11, and selects and drives the word line WL and the select gate lines SGD and SGS in accordance with the row address. This row decoder 13 includes the word line driver and the select gate line driver.

Thee column decoder 17 is attached to the sense amplifier 12. The column decoder 17 controls the column select gate circuit inside the sense amplifier 12. The row decoder 13, the column decoder 17 and the sense amplifier 12 constitute a read/write circuit for carrying out data read and data write for the memory cell array 11.

Between the external input output terminal I/O and the sense amplifier 12, data is being sent by an input and output buffer 14 and a database 21. That is, the write data provided from the input and output terminal I/O is loaded into the input and output buffer 14 and the sense amplifier 12 via the database 21. A page data read in the sense amplifier 12 is outputted to the database 21, and to the input and output terminal I/O via the input and output buffer 14.

Inputs to the control signal generating circuit (control circuit) 15 include various external control signals, for instance, chip enable signals/CE, address latch enable signals ALE, command latch enable signals CLE, write enable signals/WE, and read enable signals/RE, etc.

The control signal generating circuit 15 identifies the address Add and command Com provided from the input and output terminal I/O in accordance with these control signals. Then, the address Add is transferred to the row decoder 13 and the column decoder 17 via the address register 16. The command Com is then decoded.

The control signal generating circuit 15 carries out the operating control of all operating controls of the memory operation, for example, data write, delete and read in accordance with the external control signal and the command Com. The internal voltage generating circuit 18 generates the required internal voltage for each operation. For example, the control signal generating circuit 15 controls the internal voltage generating circuit 18, and generates various internal voltages required for writing, deleting and reading of the data.

The cell source monitor circuit 19 detects the voltage (cell source voltage Vcelsrc) of the shared source line CELSRC on the memory cell array 11, and outputs the detection signal SLM corresponding to the cell source voltage Vcelsrc. The control signal generating circuit 15 controls the voltage of the shared source line CELSRC so that it directly shifts from a first voltage during programming to a second voltage, which is the voltage required during verification after the end of programming, based on the detection signal SLM, which corresponds to the cell source voltage Vcelsrc detected from the cell source monitor circuit 19. The detection of the cell source voltage Vcelsrc by the cell source monitor circuit 19 can be carried out by comparing the cell source voltage Vcelsrc with the reference voltage Vref, using for example, an operation amplifier, etc.

The cell source monitor circuit 19 compares and amplifies the cell source voltage Vcelsrc of the shared source line CELSRC and the reference voltage Vref that is generated at the reference voltage generating circuit 20 by an operation amplifier, etc., during the reading operation (or during verification), and it is also used for maintaining the cell source voltage Vcelsrc during the reading operation at a desired voltage level.

Next, the write operation of the NAND-type flash memory of the first embodiment will be explained.

In the writing operation, verification is carried out for verifying the program for writing the data in the memory cell and whether the data has been correctly written in the memory cell or not.

Figure 3:
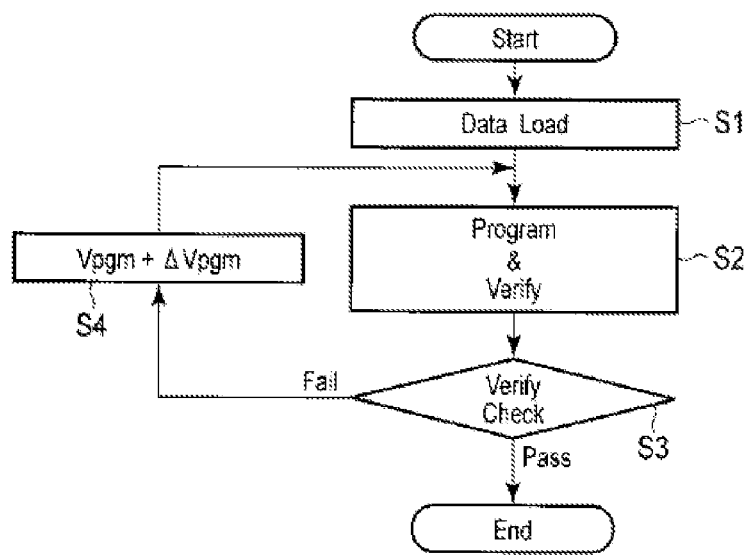
FIG. 3 is the flow chart that shows the write operation in the NAND-type flash memory of the first embodiment.

FIG. 3 is a flow chart that shows the sequence of a write operation in the NAND-type flash memory. This write operation is carried out by the control signal generating circuit 15.

When the write operation is started, first the data is loaded to the sense amplifier 12 via the I/O buffer 14 and the database 21 (Step S1). Next, the control signal generating circuit 15 carries out a program for writing the data to the memory cell, and after the program, verification is carried out to verify whether the data has been correctly written in the memory cell or not (Step S2). The program for writing the data is carried out using a write voltage Vpgm.

Next, the control signal generating circuit 15 determines the results of the verification (Step S3), and ends the write operation if the data is correctly written in the memory cell. On the other hand, if the data is not correctly written in the memory cell, the control signal generating circuit slightly increases the write voltage Vpgm, returns to step S2 with the write voltage as "Vpgm+ΔVpgm" and carries out the program and verification again (step up write). After that, the determination on the results of the verification will be repeated again. In this way, the step S2, S3, and S4 will be repeated until the data is correctly written in the memory cell.

Next, the timing chart of each signal in the write operation of the first embodiment will be explained.

Figure 4:
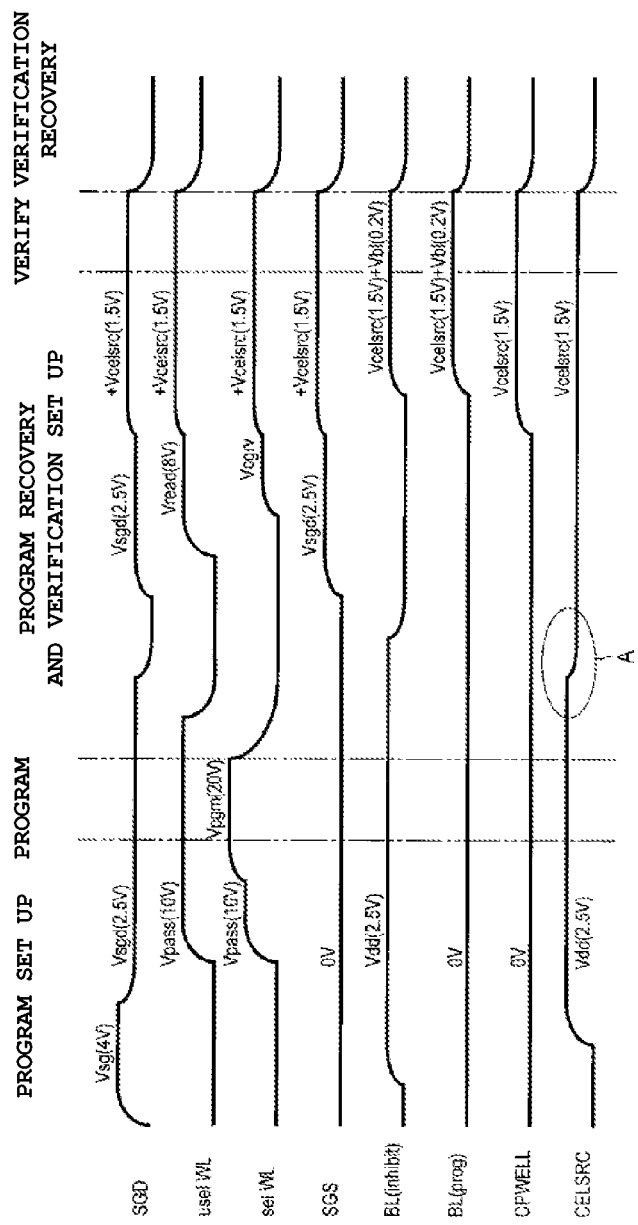
FIG. 4 is the timing chart of the write operation in the NAND-type flash memory of the first embodiment.

FIG. 4 is a timing chart of the write operation in the NAND-type flash memory.

The program and verification including the write operation carry out a sequence of program set up, program, program recovery, as well as a sequence of verification set up, verification, and verification recovery, as shown in FIG. 4.

First, during the period of program set up, the select gate line SGD of the select gate transistor SI is set to the voltage Vsg (for example, 4 V), and then, it is set to the voltage Vsgd (for example, 2.5 V). The nonselected word line (usel WL) is set to the write pass voltage Vpass (for example, 10 V). After setting the selected word line (sel WL) to the voltage Vpass (for example, 10 V), it will be set to the write voltage Vpgm (for example, 20 V).

The select gate line SGS of the select gate transistor S2 will be maintained as the voltage Vss (0 V). The bit line (hereinafter, the unwritten bit line) that is connected to the memory cell that does not carry out the writing will be set to the internal power supply voltage Vdd (2.5 V). The bit line connected to the memory cell that carries out the writing (hereinafter, write bit line) will be set to the voltage Vss (0 V).

The potential VCPWELL of the well area CPWELL in the semiconductor substrate that formed the memory cell is set to the voltage Vss (0 V). Furthermore, the cell source voltage Vcelsrc of the source line CELSRC is set to the internal power supply voltage Vdd (2.5 V).

Next, data write is carried out by the voltage set in the program set up period during programming.

In detail, the data write is carried out on a page-by-page basis with several memory cells that share one word line serving as one page. During the write, a voltage corresponding to the data is provided to the channel of the memory cell via the bit line. For example, in the case of "1" data, the internal power supply voltage Vdd (2.5 V) is given, and in the case of "0" data, the voltage Vss (0 V) is given. By giving the write voltage Vpgm (for example, 20 V) to the selected word line WL of the select page in this state, and giving the write pass voltage Vpass (for example, 10 V) to the nonselected word line WL, electrons are injected to the floating gate from the channel by FN tunneling in the memory cell allotted with "0" data. On the other hand, in the memory cell with the given "1" data, the channel potential increases and electron injection will not occur. The write pass voltage Vpass is the voltage that will turn on the memory cell regardless of the data. After that, it will transfer to the period of program recovery and verification set up.

In the period of program recovery and verification set up, as shown in FIG. 4, after the discharge of the select gate line SGD to the voltage Vss (0 V), the select gate line will be set to the voltage Vsgd (for example, 2.5 V), and set to the "voltage Vsgd+voltage Vcelsrc" that is added to the cell source voltage Vcelsrc (for example, 1.5 V) in the voltage Vsgd.

The nonselected word line (usel WL) is set to the voltage Vread (for example, 8 V) after the discharge to the voltage Vss (0 V), then it will be set to the "voltage Vread+voltage Vcelsrc" in which the cell source voltage Vcelsrc (for example, 1.5 V) is added to the voltage Vread.

After the discharge of the selected word line (sel WL) to the voltage Vss (0 V), it will be set to the voltage Vcgrv, then it will be set to the "Voltage Vcgrv+Voltage Vcelsrc" in which the cell source voltage Vcelsrc (for example, 1.5 V) is added to the voltage Vcgrv.

The select gate line SGS is set to the voltage Vsgd (for example, 2.5 V) from the voltage Vss (0 V), and then it will be set to the "voltage Vsgd+voltage Vcelsrc" in which the cell source voltage Vcelsrc (for example, 1.5 V) is added to the voltage Vsgd.

After the discharge of the unwritten bit line from the internal power supply voltage Vdd (for example, 2.5 V) to the voltage Vss (for example, 0 V), the unwritten bit line will be set to the "voltage Vcelsrc+voltage Vbl" (for example, 0.2 V). The write bit line will be set to the "voltage Vcelsrc+voltage Vbl" from the voltage Vss (0 V).

The potential VCPWELL of the well area CPWELL is set to the cell source voltage Vcelsrc from the voltage Vss (0 V). Furthermore, the cell source voltage Vcelsrc of the source line CELSRC is directly set to the cell source voltage Vcelsrc (for example, 1.5V) from the internal power supply voltage Vdd (2.5 V) as shown by A in FIG. 4. That is to say, the source line CELSRC will be directly changed to the cell source voltage Vcelsrc (1.5 V) without first discharging to the voltage Vss (0 V).

Next, during verification, the read will be carried out with the voltage that has been set during the program recovery and the verification set up, and then it will be transferred to the period of the verification recovery. Subsequently, during the verification recovery, each voltage mentioned previously will be set to the voltage Vss (0 V), and the write operation will be ended.

Hereinafter, a simple explanation with regard to the delete and read operation in the NAND-type flash memory will be provided.

The delete operation will be carried out as follows. The data delete is conducted in the block BK unit configured from several NAND cell units CU that share word lines. The voltage Vss (0 V) will be given to all word lines WL of the selected block BK, and a delete voltage (for example, 20V) will be given to the well area of the semiconductor substrate that formed the memory cell array 11. By so doing, the accumulated electrons in the floating gate of all memory cells inside the block BK will be discharged to the channel, and the threshold voltage of all of the memory cells will become in a data state (delete state) of low "1".

Next, the read operation is carried out as follows. The read voltage Vcgrv (for example, 0.5 V for A level read) is given to the selected word line WL in the select block BK of the memory cell array 11, and then the read pass voltage Vread (for example, 9.5 V) is given to turn on the memory cell regardless of the data in the nonselected word line WL. The read pass voltage (for example, 4 V) is given to the select gate lines SGD and SGS.

If the cell data of the selected memory cell is "0", the memory cell in the read voltage Vcgrv of the selected word line will not be conducted, and no cell current will flow, so the voltage of the selected bit line will remain high. On the other hand, if the cell data of the selected memory cell is "1", the memory cell will be conductive in the read voltage Vcgrv of the selected word line and cell current will flow, so the voltage of the bit line will decrease. The difference of this bit line voltage is detected by the sense amplifier 12, and the cell data of the selected memory cell will be read whether it is "0" data, or "1" data.

As has been mentioned above, the source line CELSRC is directly set to the cell source voltage Vcelsrc (1.5 V) from the internal power supply voltage Vdd (2.5 V) during the period of the program recovery and verification set up prior to verification, after the implementation of the program in the first embodiment. This can reduce the time required to charge and discharge the cell source voltage Vcelsrc, enabling it to speed up the write operation.

In the conventional write operation, the source line CELSRC discharges to the voltage Vss (0 V) from the internal power supply voltage Vdd (2.5 V) during the recovery period after carrying out the program, and then it is charged to the cell source voltage Vcelsrc (1.5 V) from the voltage Vss (0 V) during the set up of verification. For this reason, the time for discharging to the voltage Vss (0 V) from the internal power supply voltage Vdd (2.5 V) and the time for charging to the cell source voltage Vcelsrc (1.5 V) from the voltage Vss (0 V) are required.

In contrast to this, since only the time to discharge the cell source voltage Vcelsrc (1.5 V) from the internal power supply voltage Vdd (2.5 V) is required in the first embodiment, this can reduce the time to set the source voltage Vcelsrc of the source line CELSRC. In this way, the time required for the write operation can be reduced. Furthermore, charging and discharging activity of the source line CELSRC is reduced, thereby making it possible to reduce power consumption.

Second Embodiment

The NAND-type flash memory of the second embodiment will be explained.

Figure 5:
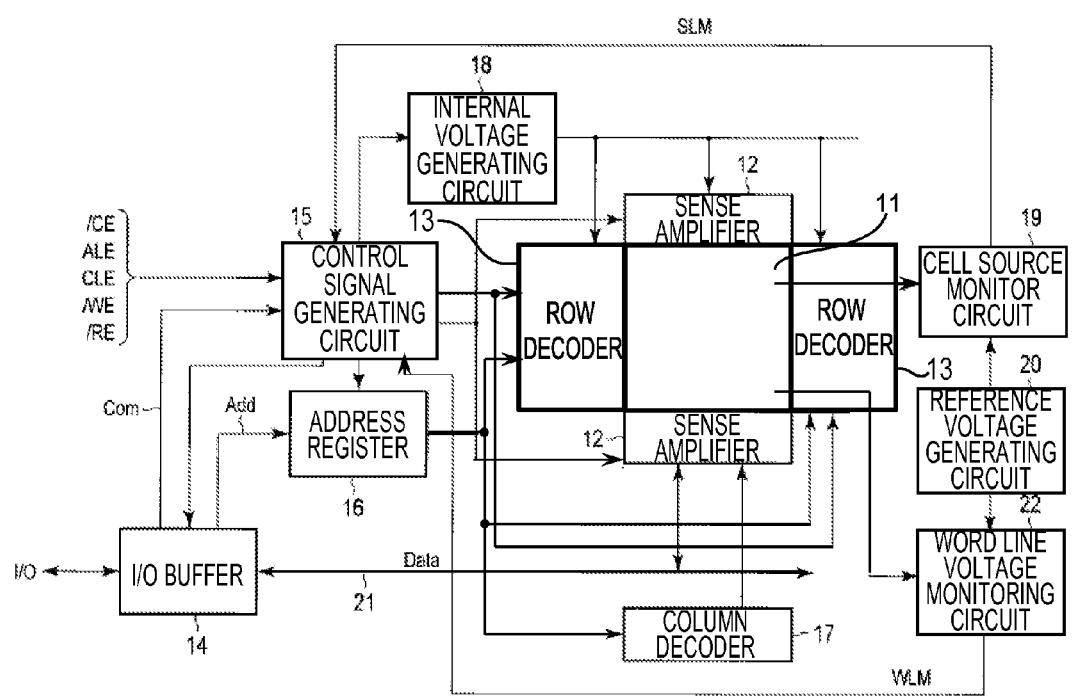
FIG. 5 is the block diagram illustrating the configuration of a NAND type flash memory of a second embodiment.

FIG. 5 is the block diagram that shows the configuration of the NAND-type flash memory of the second embodiment.

As shown in the illustration, the NAND-type flash memory is equipped with a word line voltage monitoring circuit 22, in addition to the configuration of the first embodiment as shown in FIG. 1.

The word line voltage monitoring circuit 22 detects the voltage of the word line WL of the memory cell array 11 during the write operation, and outputs the detection signal WLM corresponding to the voltage of the word line. The control signal generating circuit 15 carries out control of voltages of word lines at the time of programming, so that they are directly set to the voltage necessary at the time of verification after the end of programming, based on the detection signal WLM, in other words, based on the voltage of the word line detected by word line voltage monitoring circuit 22. More specifically, the voltage having the selected or nonselected word line WL during programming is controlled to be directly shifted to the third voltage or the fourth voltage, respectively. The detection of the word line voltage from the word line voltage monitoring circuit 22 can be carried out by comparing the word line voltage with the reference voltage Vref, using, for example, an operation amplifier, etc. Other configurations are similar to the first embodiment.

Next, the write operation of the NAND-type flash memory of the second embodiment will be explained.

The sequence of the write operation in the second embodiment is similar to the first embodiment as shown in FIG. 3, so its explanation will be omitted.

Next, the timing chart of several signals in the write operation of the second embodiment will be explained.

FIG. 6 is the timing chart of the write operation of the NAND-type flash memory of the second embodiment.

As shown in FIG. 6, the program and verification included in the write operation is carried out in the sequence of program set up, program, program recovery, verification set up, verification, and verification recovery.

The setting of voltage in the program set up and program is similar to that in the first embodiment as shown in FIG. 4.

During the program recovery and verification set up after the program set up and program have been conducted, as shown in FIG. 6, the select gate line SGD is set to the "voltage Vsgd+voltage Vcelsrc" in which the cell source voltage Vcelsrc (for example, 1.5 V) is added to the voltage Vsgd.

The nonselected word line (usel WL) is set to the voltage Vread (for example, 8 V) from the voltage Vpass (for example, 10 V) as indicated by B in FIG. 6, and it is set to the "voltage Vread+voltage Vcelsrc" in which the cell source voltage Vcelsrc (for example, 1.5 V) is added to the voltage Vread.

The selected word line (sel WL) is set to the voltage Vcgrv from the write voltage Vpgm (for example, 20 V) as indicated by B in FIG. 6, and it is set to the "voltage Vcgrv+voltage Vcelsrc" in which the cell source voltage Vcelsrc (for example, 1.5 V) is added to the voltage Vcgrv.

The select gate line SGS is set to the voltage Vsgd (for example, 2.5 V) from 0 V, and it is set to the "voltage Vsgd+voltage Vcelsrc" in which the cell source voltage Vcelsrc (for example, 1.5 V) is added to the voltage Vsgd.

After the discharge of the unwritten bit line from the internal power supply voltage Vdd (for example, 2.5 V) to 0 V, it is set to the "voltage Vcelsrc+voltage Vbl (for example, 0.2 V)". The written bit line is set to the "voltage Vcelsrc+voltage Vbl" from 0 V.

The potential VCPWELL of the well area CPWELL is set to the cell source voltage Vcelsrc from 0 V. Furthermore, similarly to that in the first embodiment, the source line CELSRC, as shown in A of FIG. 6, is directly set to the cell source voltage Vcelsrc (for example, 1.5 V) from the internal power supply voltage Vdd (2.5 V). That is, the cell source voltage Vcelsrc is directly set as the cell source voltage Vcelsrc (1.5 V).

Next, the setting of voltage during the period of verification and verification recovery is similar to that in the first embodiment as shown in FIG. 4. Thus, the write operation is ended.

In the second embodiment, similarly in the first embodiment, after carrying out the program, the cell source voltage Vcelsrc of the source line CELSRC is directly set to the cell source voltage Vcelsrc (1.5 V) from the internal power supply Vdd (2.5 V) during the period of program recovery and verification set up. In this way, it can reduce the time required for charging and discharging the cell source voltage Vcelsrc, making it possible to carryout the writing operation at high speed.

In addition, the nonselected word line (usel WL) is directly set to the voltage Vread (for example, 8 V) from the voltage Vpass (for example, 10 V) in the period of program recovery and verification set up. Furthermore, the selected word line (sel WL) is directly set to the voltage Vcgrv from the write voltage Vpgm (for example, 20 V). And the select gate line SGD is directly set to "voltage Vsgd+voltage Vcelsrc" in which the cell source voltage Vcelsrc (for example, 1.5 V) is added to the voltage Vsgd from the voltage Vsgd. In this way, it is possible to reduce the charge and discharge carried out for the nonselected word line, the selected word line and the select gate line SGD, making it also possible to reduce energy consumption.

As explained above, according to the first embodiment and the second embodiment, a nonvolatile semiconductor memory device that can carry out a write operation at high speed can be provided. In other words, the first embodiment and the second embodiment can achieve high speed writing operation by reducing an excess operation (charge and discharge and others) by rendering the program and verification as a series of sequences. In this way, it is possible to provide about 3-4% faster speed of write operation. Furthermore, excess charging and discharging can be reduced, making it also possible to reduce energy consumption.

Embodiments provide a control method of word lines and source lines during the program operation and verification operation in a nonvolatile semiconductor memory device. This is effective in high speed operation by preparing the next operation during the recovery of the source lines and word lines at each operation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
   a memory cell array having a plurality of memory cells arranged at intersections of word lines and bit lines;
   a control circuit configured to carry out a write operation including a program for carrying out writing data to a memory cell, and verification for verifying whether the data has been correctly written to the memory cell by the program; and
   a source line monitoring circuit configured to detect a voltage of a source line connected to the memory cell during the write operation,
   wherein the control circuit is configured to directly shift the voltage of the source line, without first discharging the source line, from a first voltage equal to a voltage of the source line during the program to a second voltage equal to a voltage required at the time of verification after the end of the program.

2. The nonvolatile semiconductor memory device according to claim 1, wherein the control circuit is configured to directly shift the voltage of the source line from the first voltage to the second voltage based on the voltage of the source line detected by the source line monitoring circuit.

3. The nonvolatile semiconductor memory device according to claim 2, wherein the control circuit is configured to directly shift the voltage of the source line from the first voltage to the second voltage when the voltage of the source line detected by the source line monitoring circuit after the end of the program is the first voltage.

4. The nonvolatile semiconductor memory device according to claim 1, further comprising:
a word line monitoring circuit configured to detect a voltage of the word line during the write operation,
wherein the control circuit is further configured to directly shift a voltage of a selected word line to a third voltage, and directly shift a voltage of a nonselected word line to a fourth voltage, based on the voltage of the word line detected by the word line monitoring circuit.

5. The nonvolatile semiconductor memory device according to claim 4, wherein the control circuit is configured to directly shift a voltage of a gate line of a select transistor connected to the memory cell from a fifth voltage that has been set during the program to a sixth voltage required at the time of verification after the end of the program.

6. The nonvolatile semiconductor memory device according to claim 1, wherein the control circuit is configured to shift the voltage of the source line from the first voltage to the second voltage without the source line being discharged to a voltage lower than the second voltage.

7. The nonvolatile semiconductor memory device according to claim 1, wherein the memory cell array includes memory cells connected in series, and a cell unit including a select transistor connected to both ends of the memory cells, and wherein the source line is connected to one end of the cell unit.

8. A nonvolatile semiconductor memory device, comprising:
a memory cell array having a plurality of memory cells arranged at intersections of word lines and bit lines;
a control circuit configured to carry out a write operation including a program for carrying out writing data to a memory cell, and verification for verifying whether the data has been correctly written to the memory cell by the program;
a source line monitoring circuit configured to detect a voltage of a source line connected to the memory cell during the write operation; and
a word line monitoring circuit configured to detect a voltage of the word line during the write operation,
wherein the control circuit is configured to directly shift each voltage of the source line and a selected word line from a high level to a low level without discharging either the source line or the selected word line to a level that is lower than the low level.

9. The nonvolatile semiconductor memory device according to claim 8, wherein the control circuit is configured to directly shift each voltage of the source line and the selected word line from a high level to a low level without discharging either the source line or the selected word line to a ground reference voltage.

10. The nonvolatile semiconductor memory device according to claim 8, wherein the control circuit is configured to directly shift the voltage of the source line based on the voltage of the source line detected by the source line monitoring circuit and the voltage of the selected word line based on the voltage of the word line detected by the word line monitoring circuit.

11. The nonvolatile semiconductor memory device according to claim 8, wherein the memory cell array includes memory cells connected in series, and a cell unit including a select transistor connected to both ends of the memory cells, and wherein the source line is connected to one end of the cell unit.

12. The nonvolatile semiconductor memory device according to claim 8, wherein the control circuit is configured to directly shift a voltage of a gate line of a select transistor connected to the memory cell between two levels at the time of verification after the end of the program.

13. The nonvolatile semiconductor memory device according to claim 12, wherein the lower of the two levels is greater than zero.

14. A method of writing data to a nonvolatile semiconductor memory device having a memory cell array having a plurality of memory cells arranged at intersections of word lines and bit lines, said method comprising:
writing data to a memory cell according to a program during a writing operation;
after the end of the program, directly shifting a voltage of a source line connected to the memory cell, without first discharging the source line, from a first voltage equal to a voltage of the source line during the program to a second voltage equal to a voltage of the source line required at the time of verification of data written to the memory cell; and
verifying whether the data has been correctly written to the memory cell.

15. The method according to claim 14, further comprising:
detecting a source line voltage at the source line,
wherein the voltage of the source line is directly shifted from the first voltage to the second voltage based on the detected source line voltage.

16. The method according to claim 15, wherein the voltage of the source line is directly shifted from the first voltage to the second voltage when the voltage of the source line detected by the source line monitoring circuit after the end of the program is the first voltage.

17. The method according to claim 14, further comprising:
directly shifting a voltage of a selected word line to a third voltage after the end of the program; and
directly shifting a voltage of a nonselected word line to a fourth voltage after the end of the program.

18. The method according to claim 17, further comprising:
detecting a word line voltage at the selected word line,
wherein the voltages of the selected and nonselected word lines are directly shifted based on the detected word line voltage.

19. The method according to claim 17, further comprising:
after the end of the program, directly shifting a voltage of a gate line of a select transistor connected to the memory cell from a fifth voltage that has been set during the program to a sixth voltage required at the time of verification.

* * * * *